United States Patent [19]

Akao et al.

[11] Patent Number: 5,049,926
[45] Date of Patent: Sep. 17, 1991

[54] IMAGE RECORDING APPARATUS HAVING A MECHANISM FOR VARYING COPYING MAGNIFICATION

[75] Inventors: Michitoshi Akao; Katsuyoshi Sonobe; Kazuichi Sakaida; Nobuo Aoki, all of Nagoya; Satoshi Uchiyama, Kasugai; Hiroshi Igarashi, Nagoya, all of Japan

[73] Assignee: Brother Kogyo Kabushiki Kaisha, Aichi, Japan

[21] Appl. No.: 470,899

[22] Filed: Jan. 26, 1990

[30] Foreign Application Priority Data

Jan. 27, 1989 [JP] Japan .................................. 1-9155[U]
Jan. 30, 1989 [JP] Japan .................................. 1-9774[U]
Jan. 31, 1989 [JP] Japan .................................. 1-21769
Feb. 20, 1989 [JP] Japan .................................. 1-39964

[51] Int. Cl.$^5$ .............................................. G03B 27/52
[52] U.S. Cl. ......................................... 355/55; 355/58
[58] Field of Search ...................... 355/27, 28, 55, 56, 355/57, 58, 243, 32, 43, 60

[56] References Cited

U.S. PATENT DOCUMENTS 4,421,405 12/1983 Nagahara ............................. 355/58

Primary Examiner—Brian W. Brown
Assistant Examiner—Khanh Dang
Attorney, Agent, or Firm—Oliff & Berridge

[57] ABSTRACT

An image recording apparatus for recording an image corresponding to an original on a photosensitive recording medium by irradiating light onto the original and converging light from the original onto the photosensitive recording medium. The apparatus includes a lens unit vertically movably supported by the frame, a plurality of position setting holes arrayed in a vertical direction of the frame, position setting means provided on the lens unit and capable of being inserted into one of the position setting holes for fixing the lens unit to the frame, urging means provided on the lens unit for urging the position setting means toward the frame to project the position setting means, actuating means provided on the lens unit for actuating the position setting means so that the position setting means retracts and moves away from the frame against urging force of the urging means when electric current is supplied to the actuating means. The apparatus further includes control means for controlling the actuating means so that when an error is detected during movement of the lens unit, electric current to the actuating means is cut off to project the position setting means by the urging force of the urging means and to fix the lens unit to the frame.

17 Claims, 9 Drawing Sheets

IMAGE RECORDING APPARATUS HAVING A MECHANISM FOR VARYING COPYING MAGNIFICATION

BACKGROUND OF THE INVENTION

The present invention relates to an image recording apparatus such as a copying machine, more particularly to an improvement on a mechanism for varying copying magnification for forming a different copying magnification image corresponding to an original on a photosensitive recording medium.

In general, on the recording apparatus, a mechanism for varying copying magnification is employed to form a different copying magnification image on a photosensitive recording medium. A lens unit is moved to and positioned at a position corresponding to copying magnification by the mechanism for varying copying magnification.

In one conventional image recording apparatus, the mechanism for varying copying magnification comprises a position setting pin provided on a lens unit and actuated by a driving means such as a solenoid, a plurality of position setting holes vertically arranged on a frame of the copying machine for fixing the lens unit at the positions corresponding to the copy magnifications.

With this structure, the lens unit is moved vertically by a driving means such as a stepper motor in accordance with the changed copying magnification, then when the position setting pin reaches a position corresponding to a prescribed position setting hole, the position setting pin is actuated toward the frame and inserted into the position setting hole by the solenoid, to thereby fix the lens unit to the frame.

However, since the conventional copying machine, having the mechanism for varying copying magnification, has a safety mechanism for cutting off a power supply when an error such as the opening of a cover for covering an original occurs during copying operation, if an error occurs during movement of the lens unit, the lens unit is stopped before the lens unit reaches the position setting hole. That is, the position setting pin is not inserted into the position setting hole and the lens unit is stopped in a precarious condition. As a result, the lens unit may move by itself with a shock or the like and, in some cases, the lens unit may drop to a lowermost position and be broken.

Further, when the power supply the overall machine is cut off due to a power failure pulled plug or switching off, the same problem occurs.

SUMMARY OF THE INVENTION

It is an object of the present invention to provide an image recording apparatus including means for fixing the lens unit so that even if an error occurs during movement of the lens unit, the lens unit is promptly and firmly fixed to the frame.

Another object of the present invention is to provide an image recording apparatus including means for adjusting an optical axis of a condensing lens so that the optical axis of the condensing lens can be easily adjusted.

According to the present invention, there is provided an image recording apparatus for recording an image corresponding to an original on a photosensitive recording medium by irradiating light onto the original and converging light from the original onto said photosensitive recording medium, the apparatus comprising a frame, a light source for irradiating light onto said original, a lens unit, provided between said light source and an exposure zone at which the recording medium is exposed and movably supported by said frame along a path of light from said original, for converging light from said original and forming an image on said photosensitive recording medium, drive means for moving said lens unit along said path of light, magnification setting means for setting magnification, a plurality of position setting portions provided in said frame and arrayed in parallel to said path of light, neighboring position setting means being spaced away from each other, position setting portions provided on said lens unit and being engageable with one of said position setting portions for fixing said lens unit to said frame, urging means provided on said lens unit for urging said position setting means toward said frame, actuating means provided on said lens unit for actuating said position setting means so that said position setting means moves away from said frame against urging force of said urging means when electric current is supplied to said actuating means and control means for controlling said drive means and said actuating means to move said lens unit in response to said magnification set by said magnification setting means while supplying electric current to said actuating means.

With the above structure, when the lens unit is fixed at a certain position, the setting means is projected toward the frame by an urging force of the urging means to position the lens unit. While the lens unit is being moved, the position setting means is retracted from the frame against the urging force of the urging means by the actuating means actuated by the electric current. When an error of the copying machine is detected, electric current to the actuating means is cut off by the control means and only urging force of the urging means is applied to the position setting means to thereby project the position setting means and press the position setting means against the frame. Therefore, the lens unit is fixed to the frame. Further, when a power failure occurs, the position detecting means is operated in the same way as the above case to fix the lens unit to the frame.

In another aspect of the present invention, there is provided an image recording apparatus for recording an image corresponding to an original on a photosensitive recording medium by irradiating light onto the original and converging light from the original onto said photosensitive recording medium, the apparatus comprising a frame, a light source for irradiating light onto said original, a lens unit provided between an exposure zone at which the recording medium is exposed and said light source for converging light from said original and forming an image on said photosensitive recording medium; said lens unit comprising, an attachment plate vertically movably supported by said frame, a movable plate vertically movably attached to said attachment plate and a condensing lens rotatably mounted on said movable plate for converging light from said original and forming an image on said photosensitive recording medium.

In still another aspect of the present invention, there is provided an image recording apparatus for recording an image corresponding to an original on a photosensitive recording medium by irradiating light onto the original and converging light, from the original onto said photosensitive recording medium, the apparatus comprising a frame, a light source for irradiating light onto said original, a lens unit provided between said light source and an exposure zone at which the recording medium is exposed for converging light from said original and forming an image on said photosensitive recording medium; said lens unit comprising, an attachment plate vertically movably supported by said frame, said attachment plate having a first pin, a condensing lens body supported on said attachment plate for converging light from said original and forming an image on said photosensitive recording medium, said condensing lens body having a guide groove extending in one direction and engageable with said first pin and a sliding plate supported on said attachment plate, said sliding plate being movable in a second direction perpendicular to said first direction and having a second pin engageable with said guide groove so that movement of said sliding plate causes said condensing lens body to pivot about said first pin.

The above and other objects, features and advantages of the present invention will become more apparently from the following description when taken in conjunction with the accompanying drawings in which preferred embodiments of the present invention are shown by way of illustrative examples.

DETAILED DESCRIPTION OF THE PREFERRED EMBODIMENTS

A first embodiment of an image recording apparatus according to the invention will described below with reference to FIGS. 1 through 3.

Figure 1:
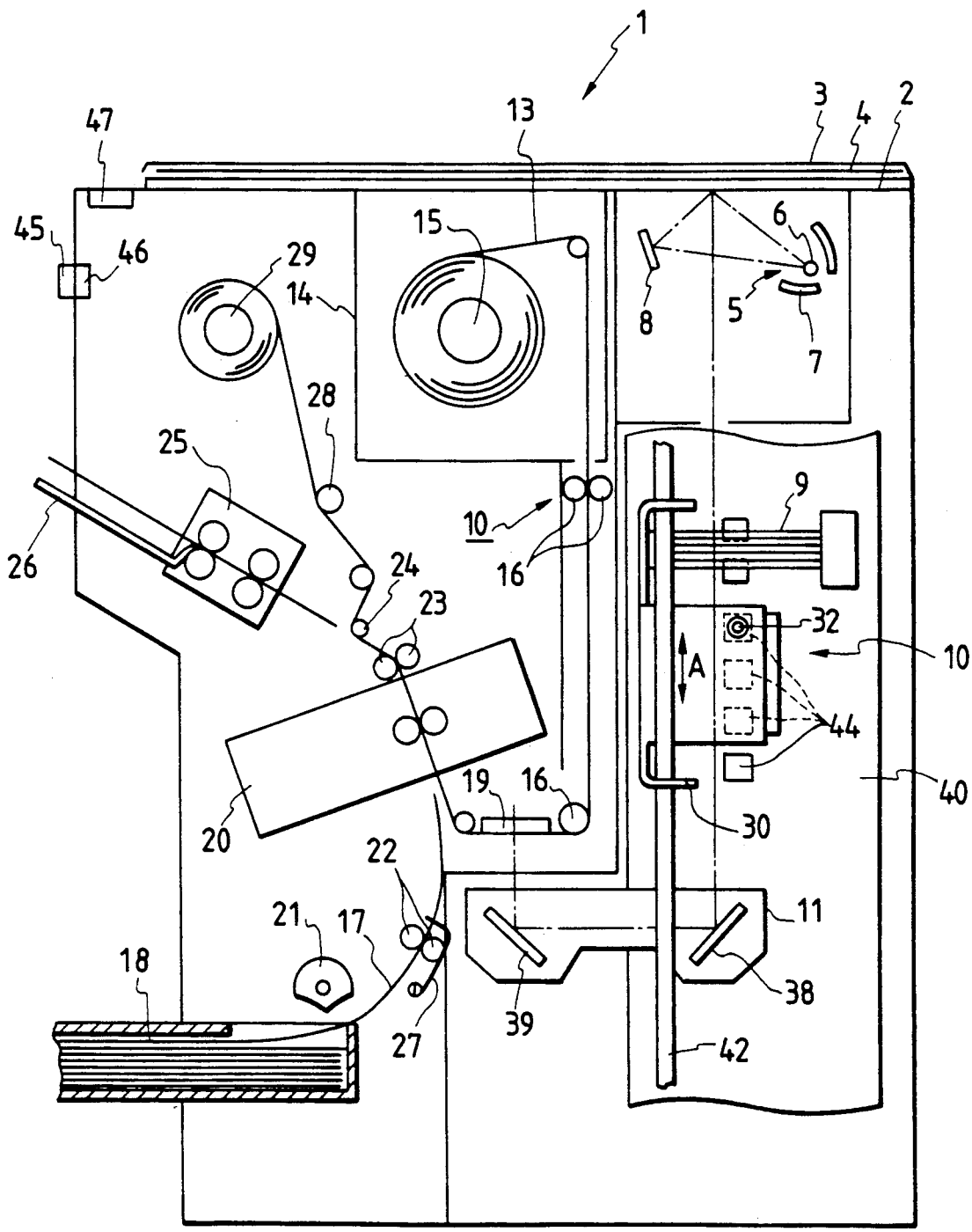
FIG. 1 is a schematic vertical cross-sectional view of image recording apparatus according to the present invention.

FIG. 1 schematically shows a copying machine capable of performing full-color copying. This machine employs the transfer type image recording medium including a microcapsule sheet and a developer sheet as described in U.S. Pat. No. 4,399,209. The microcapsule sheet and the developer sheet will not be described in detail below.

The copying machine, generally described by the reference numeral 1 in FIG. 1, includes an upper assembly having an original support stand glass 2 which is movable back and forth and an original support stand glass cover 3 which can be placed over the original support stand glass 2. A desired original 4 to be copied is placed in the original support stand glass 2 in a face down position.

The copying machine 1 also has a light source 5 placed in an upper righthand portion thereof below the original support stand glass 2. The light source 5 comprises a halogen lamp 6 extending in a direction normal to the direction in which the original support stand glass 2 is moved, and a semicylindrical reflecting mirror 7 disposed in surrounding relation to halogen lamp 6 for reflecting light from the halogen lamp 6 toward the original support stand glass 2. The light source 5 emits a linear light toward the lower surface of the original support stand glass 2 through a slit provided at the upper side of the copying machine 1. The light from the light source 5 passes through the transparent original support stand glass 2. Therefore, while the original support stand glass 2 moves, the light emitted from the halogen lamp 6 continuously irradiates the entire surface of the original support stand glass 2 from the lefthand to the righthand end thereof (as viewed in FIG. 1). The light from the light source 5 passes through the transparent original support stand glass 2, and is then reflected from the original 4 placed on the original support stand glass 2. The original stand glass cover 3 covers the entire upper surface of the original support stands glass 2 so that the light applied to the original support stand glass 2 will not leak from those areas of the original support stand glass 2 which are not covered by the original 4. A flat reflector 8 is positioned on the lefthand side of the light source 5 for applying light emitted from the halogen lamp 6 to the original 4 highly efficiently. The light reflected from the original 4 on the original support stand glass 2 is directed downwardly and passes through a filter unit 9 and enters a lens unit 10.

The filter unit 9 alters the transmissive characteristics of the light reflected from the original 4 in accordance with the sensitivity characteristics of a microcapsule sheet 13, to thereby adjust the color tone of a copied output image.

Figure 2:
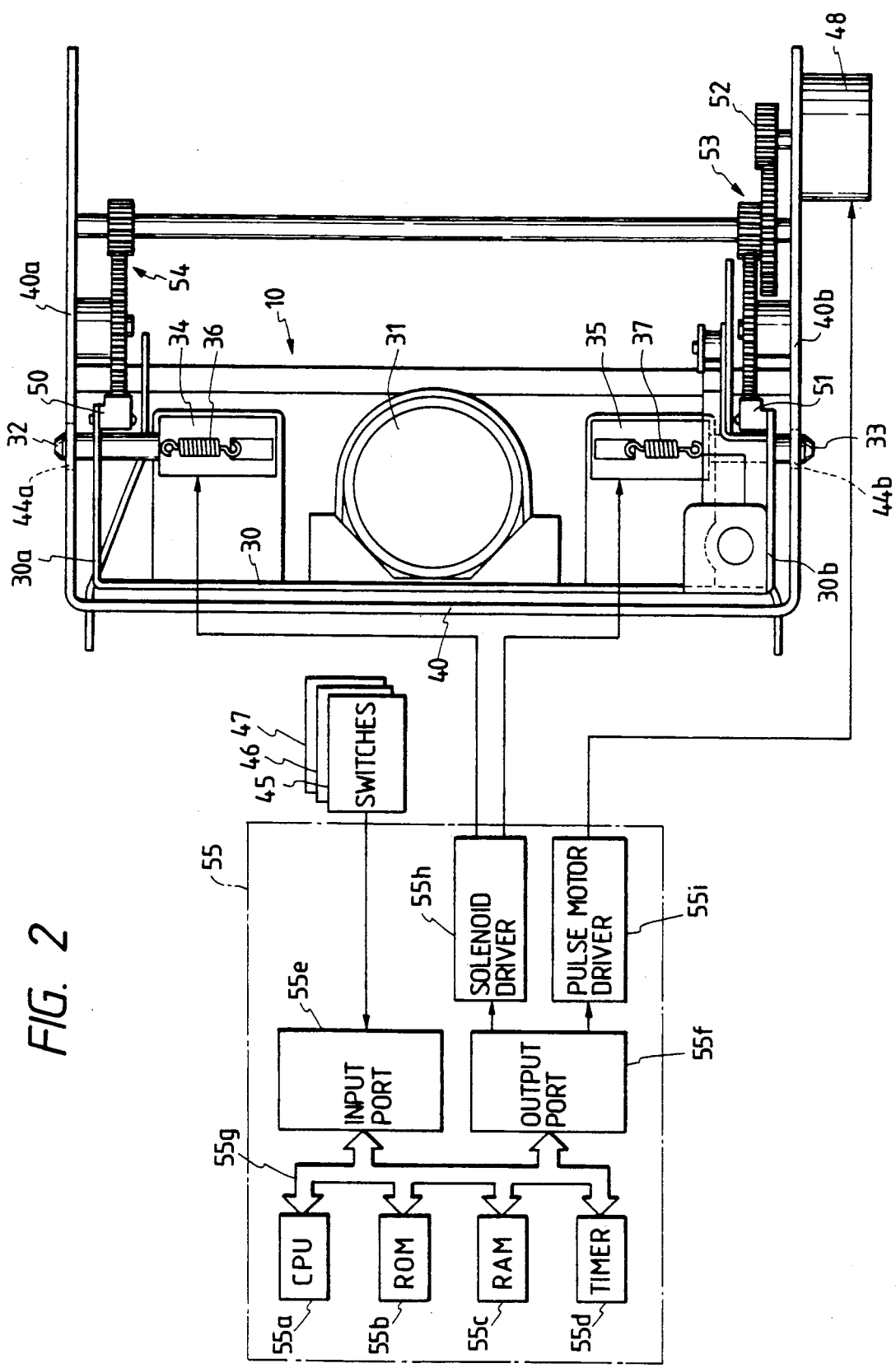
FIG. 2 is a plan view of a mechanism for fixing a position of a lens unit and a block diagram according to the present invention.
Figure 3:
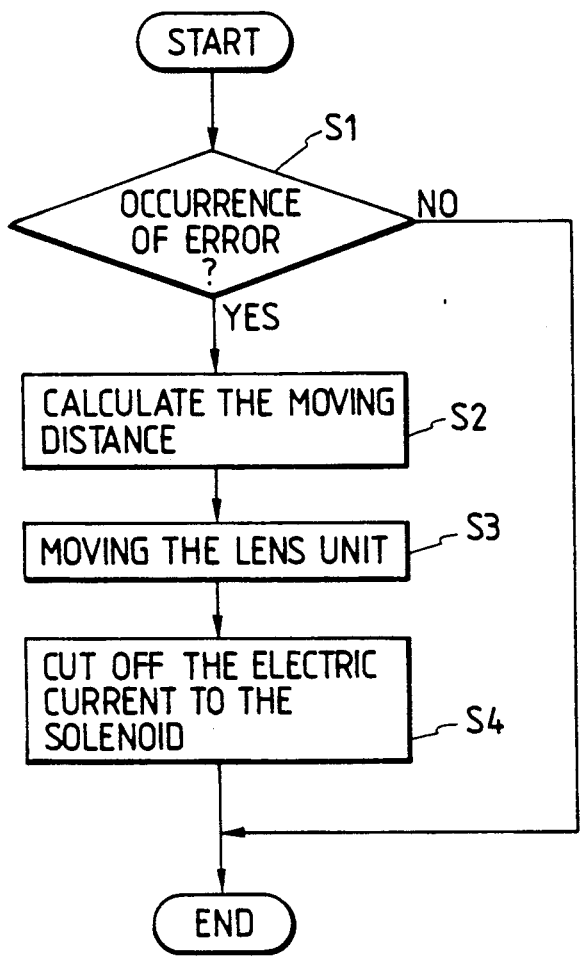
FIG. 3 is a flow chart for showing operation of the control unit of a mechanism for varying copying magnification according to the first embodiment of the invention.

The lens unit 10 includes a lens holder 30 on which a condensing lens 31, position setting pins 32,33, and solenoids 34, 35 are provided as shown in FIG. 2. The lens unit 10 is vertically movably supported by a frame 40 fixedly provided in the copying machine 1 and is guided along a moving direction thereof (the direction as shown by arrow A in FIG. 1) by a lens arbor 42 extending in a vertical direction. The frame 40 is provided, on side plates 40a, 40b thereof with a plurality of paired position setting holes 44a, 44b each of which are arrayed in a vertical direction of the frame 40 with a certain interval between two adjacent holes in accordance with copying magnification. The position setting pins 32, 33 are inserted into a respective one of the plurality of said position setting holes 44a, 44b on side plates 40a, 40b of the frame 40.

Below the lens unit 10 there is provided a mirror unit 11 for varying the light path of the light converged by the lens unit 10, the mirror unit 11 comprises a pair of reflecting mirrors 38, 39 which are positionally adjustably provided on the attachment plate (see FIG. 1). The light converged by the lens unit 10 is directed 180 degrees back by the mirror unit 11 and then focused on the microcapsule sheet 13 held closely against the surface of an exposure table 19.

The microcapsule sheet 13 carrying microcapsules which encapsulate therein dye precursor is of a continuously elongated length and wound around a cartridge reel 15 which is placed in a removable cartridge 14. A leading end portion of the microcapsule sheet 13 withdrawn from the cartridge 14 extends through a plurality of feed rollers 16 toward a take-up reel 29. A latent image can be formed successively on the microcapsule sheet 13 by exposure when it moves past the exposure table 19.

A developer sheet cassette 18 storing developer sheets 17 having a predetermined size is detachably disposed below the exposure table 19 in the copying machine 1. The developer sheet 17 has developer material which provides an output image upon reaction with the dye precursor. Immediately above the cassette 18, a sector roller 21 is provided to feed each one of the developer sheets 17 toward a pressure developing unit 20 which is provided between the exposure table 19 and the take-up reel 29.

The microcapsule sheet 13 and the developer sheet 17 are closely held against each other when they are introduced into the pressure developing unit 20. The microcapsule sheet 13 and the developer sheet 17 are sandwiched and pressed together. Those microcapsule in the microcapsule layer which are not exposed are ruptured under pressure, and a developed color image is transferred onto the developer sheet 17.

Between the cassette 18 and the pressure developing unit 20 there are provided a plurality of feed rollers 22 and a resist-gate 27 for feeding the developer sheet 17 toward the pressure developing unit 20 and aligning a leading edge of the developer sheet 17. The microcapsule sheet 13 and the developer sheet 17 which have left the pressure developer unit 20 are fed by rollers 23. Then, the microcapsule sheet 13 is separated from the developer sheet 17 by a separator rolled 24. The microcapsule sheet 13 is directed upwardly, whereas the developer sheet 17 travels ahead into a thermal fixing unit 25 provided at a downstream side of the separator roller 24. After color development on the developer sheet 17 is promoted and the color image fixed by the thermal fixing unit 25, the developer sheet 17 is discharged into a tray 26 with the developed image facing up. The separated microcapsule sheet 13 travels past a meander roller 28 and is then wound around the take-up reel 29.

The copying machine 1 has a power switch 45 for switching on/off the power supply, a safety switch 46 for switching off the power supply when the original support stand glass cover 3 is open, and a copying magnification setting switch 47 for setting copying magnification.

In case of making a color copy by copying machine 1 of this embodiment, when a start button ( not show ) is depressed, the original support stand glass 2 is moved to one direction, so that one side edge of the original support stand glass 2 stops at a position where the one side of the original support stand glass 2 is coming into confrontation with the halogen lamp 6 of the light source 5. Thereafter, with the halogen lamp 6 being lighted, the original support stand glass 2 is then moved in a leftward direction until light irradiation against the original 4 finishes. At this time, since the microcapsule sheet 13 is moved under the exposure table 19 in the leftward direction at the same speed as the moving speed of the original support stand glass 2, the latent image corresponding to the original image is formed on the microcapsule sheet 13. On the other hand, the developer sheet 17 is fed from sheet cassette 18 to the pressure developing unit 20 in synchronism with the leftward return motion of the original support stand glass 2. Therefore, microcapsule sheet 13 and the developer sheet 17 are in close contact therewith in the pressure developing unit 20 and the color image is formed on the developer sheet 17. Thereafter, the developer sheet 17 is introduced into the thermal fixing unit 25, the color image is thermally fixed inside the thermal fixing unit 25 by heat and then the developer sheet 17 is discharged into the tray 26.

Next, a machine for varying copying magnification will be described in detail.

A copying magnification is changed by changing the position of the lens unit 10 vertically. The ratio of the moving speed of the original 4 and the feeding speed of the microcapsule sheet 13 is also changed in accordance with copying magnification.

As shown in FIG. 2 the pair of position setting pins 32,33 connected to the respective solenoids 34, 35 are provided so that the position setting pins 32, 33 project outwardly from both side portions 30a, 30b of the lens holder 30 toward both side plates 40a, 40b of the frame 40. The position setting pins 32, 33 are urged inwardly when the solenoids 34, 35 are actuated, to thereby retract the position setting pins 32, 33. Springs 36,37 are attached to the position setting pins 32, 33 to cause them to project outwardly respectively.

Further, a stepper motor 48 for driving the lens unit 10 is mounted on one side portion 40b of the frame 40. Racks 50,51 are fixedly secured to the both side portions 30a, 30b of the lens holder 30. The stepper motor 48 has a rotating shaft having a gear 52 which is meshingly interlinked with the rack 51 through a gear train 53. The gear 52 is also meshingly interlinked with the rack 50 through a gear train 54. Therefore, when the stepper motor 48 is energized, the racks 50,51 are moved vertically, thus moving the lens unit 10 vertically.

The stepper motor 48 and solenoids 34,35 are connected to a control unit 55. The control unit 55 comprises a central processing unit (CPU) 55a, a ROM 55b, a RAM 55c, a timer 55d, an input port 55e, an output port 55f and a bus 55g connecting each component with one another. The output port 55f is connected to the solenoids 34, 35 through a solenoid driver 55h and to the stepper motor 48 through a stepper motor driver 55i. The input port 55e is connected to the respective switches 45,46,47.

Next, operation of the mechanism for varying copying magnification thus constructed will be described below.

While the copying machine 1 is fixed at a certain magnification, the solenoids 34, 35 are switched off. Therefore, the position setting pins 32,33 are inserted into and engaged with the respective position setting holes 44a, 44b by urging forces of the springs 36, 37 and the lens unit 10 is fixed at a certain position.

When the copying magnification setting switch 47 is operated to change the copying magnification of the copying machine 1, a signal instructing a new magnification is input into the control unit 55 from the copying magnification setting switch 47. Next, a control signal is output from the control unit 5 in response to the input signal and the solenoids 34, 35 are actuated by the control signal. As a result, the position setting pins 32, 33 are retracted inwardly against urging forces of the springs 36, 37 and pulled out of the position setting holes 44a, 44b, the lens unit 10 is thus released from a condition fixed to the frame 40 and becomes a movable condition.

After the lens unit 10 is freely movable, the stepper motor 48 is rotated in accordance with the control signal from the control unit 55. The lens unit 10 is then moved to the position of the position setting holes 44a, 44b corresponding to the changed copying magnification. When the lens unit 10 reaches a predetermined position, a rotation of the stepper motor 48 is stopped and electric current supplied to the solenoids 34, 35 is cut off. Since the urging forces of the solenoids 34, 35 disappear when cutting off the electric current, the position setting pins 32, 33 project by urging forces of the springs 36, 37 and are inserted into and engaged with the position setting holes 44a, 44b formed on the frame 40, to thereby fix the lens unit 10 to the frame 40.

If while the above operation is being carried out, that is, the lens unit 10 is being moved, for example, when the original support stand glass cover 3 is open by an error, or the power switch 45 is turned off, or a plug of the copying machine 1 drops out of a socket, or a stoppage of electric current occurs, that is the electric current supplied to the overall copying machine 1 is cut off thus cutting off the electric current supplied to the solenoids 34,35, then only urging forces of the springs 36, 37 are applied to the position setting pins 32, 33 and the position setting pins 32, 33 project outwardly to push against the wall surfaces of the frame 40. As a result, the tip ends of the position setting pins 32, 33 are brought in close contact with the wall surfaces of the frame 40, to thereby fix lens unit 10 to the frame 40.

In view of the foregoing, in the first embodiment, even if any occurs such as opening the cover 3 or a power failure, during movement of the lens unit 10 and the electric current to the copying machine is cut off, the lens unit 10 is promptly and firmly fixed to the frame 40, thereby avoiding breakage of the precise lens unit 10 caused by unexpected movement of the lens unit 10.

Next, a modified mechanism for varying copying magnification will be described below with reference to FIG. 3.

In this modification, the general structure of the mechanism for varying copying magnification is identical with the mechanism illustrated in FIGS. 1 and 2, however, an improved control system is provided. In the improved control system, even if any error occurs, a prescribed control is carried out without cutting off the power supply of the overall copying machine 1.

In this modification, ROM (storage means) 55b of the control unit 55 stores routine in which a moving distance is calculated by the position of the lens unit 10 when an error has occurred and the position of the position setting holes 44a, 44b positioned at an adjacent position, in addition to data of the stop position of the lens unit 10 corresponding to the respective position setting holes 44a, 44b. The position setting hole positioned at the adjacent position is defined as either the position setting hole positioned at the nearest position of the position of the lens unit 10 where the error has occurred or the position setting hole positioned immediately below the position of the lens unit 10 where the error has occurred.

Next, a controlling mode of the modified embodiment will be described with reference to a flow chart illustrated in FIG. 3.

In step S1, occurrence of an error is detected during movement of the lens unit 10. In step S2, the moving distance from the position where the error has occurred to the position of the position setting holes 44a, 44b positioned at the adjacent position is calculated without cutting off the electric power of the overall copying machine 1. In step S3, the lens unit 10 is moved to the position setting holes 44a, 44b by rotating the stepper motor 48 on the basis of the calculated moving distance. After the movement of the lens unit 10, the electric current supplied to the solenoids 34, 35 is cut off and the position setting pins 32,33 are projected to insert them into the position setting holes 44a, 44b to thereby fix the lens unit 10 to the frame 40 in step S4. Thereafter the power supply to the overall copying machine 1 is cut off.

In summary, in this modification, when an error such as an opening of the cover 3 occurs, after the lens unit 10 is moved the position setting holes 44a, 44b positioned at the adjacent position, the position setting pins 32, 33 are inserted into and engaged with the position setting holes 44a, 44b to thereby fix the lens unit 10 to the frame 40 more firmly when compared with the foregoing embodiment.

Several modifications may be made to the first embodiment. For example, means for projecting the position setting pins 32,33 can be replaced with a motor or the like.

A second embodiment will be described below with reference to FIGS. 4 through 6. The second embodiment pertains to an improvement on the first embodiment. That is, in the mechanism for varying copying magnification according to the first embodiment, a plurality of the actuators for the position setting pins 1 (two actuators in the illustrated embodiment in FIGS. 1 and 2) are required, so that the overall apparatus becomes much heavier, and assembling of the apparatus and wiring may be troublesome, resulting in higher cost. Further, since the lens unit, that moves vertically is heavy, a driving source for driving the lens unit must be powerful.

Furthermore, in order to meet the demand of miniaturization of the overall copy machine, if a plurality of actuators are disposed in a small apace, the design of the overall copying machine becomes complex.

The second embodiment can solve such disadvantages implicit in employing a plurality of actuators. It is, therefore, an object of the present invention to provide an recording apparatus which is a light weight structure, can be easily designed and assembled, and can be manufactured at a lower cost.

In the second embodiments, general structure of the copying machine is identical with the machine shown in FIG. 1. However, in the second embodiment, an improved mechanism for varying copying magnification for incorporation in the copying machine is provided as shown in FIGS. 4 through 6. Those parts shown in FIGS. 4 through 6 which are identical to those of FIG. 2 are denoted by identical reference numerals.

In this embodiment, there is provided a frame 40 having two vertical side plates 40a, 40b in parallel with each other. In FIG. 5, only side plates 40a, 40b are cut away for convenience of description. The side plates 40a, 40b are provided with a plurality of paired position setting holes 44a, 44b, respectively, which are arrayed in a vertical direction with a certain interval between two adjacent holes. A lens holder 30 is disposed immediately inside the frame 40. The lens holder 30 is formed by folding back both side portions of a flat plate into an approximately U-shape in cross-section, the lens holder 30 being dispose vertically. Side portions 30a, 30b are parallel to the side plates 40a, 40b respectively. At the central portion of the lens holder 30, the condensing lens 31 is provided with its orientation with respect to optical axis adjustable for a small amount of degrees.

Supporting plates 63a, 63b each having a horizontal surface are provided on both sides of the lens holder 30, and the condensing lens 31 is located between two supporting plates 63a, 63b. As shown in FIG. 6 one supporting plate 63a has a forward end portion bent downwardly to which a solenoid 64 is fixed, a longitudinal axis of the solenoid 64 extending toward the side plates 40a, 40b of the frame 40.

Further, a stopper 65 having a rectangular bottom plate is provided on the horizontal surface of the supporting plate 63a. The stopper 65 is formed with two oblong-shaped guide holes 65h in a longitudinal direction which are inserted into and engaged with two guide pins 65e provided vertically on the supporting plate 63a. The stopper 65 is slidingly movable toward and away from side plate 40a. The stopper 65 has a first projecting portion 65a extending upwardly at its side end positioned at the side where the condensing lens 31 located, and a second projecting portion 65b extending upwardly and positioned adjacent to the first projecting portion 65a. The stopper 65 has a bracket 65d projecting downwardly and having approximately U-shaped cross-section at its side end positioned at the side where the side plate 40a is located. On the bracket 65d there is provided a third projecting portion 65c with which a tube 66 is fitted as shown in FIGS. 4 and 6.

The side end of the stopper 65 at the side where the side plate 40a is located passes through a hole 30d formed on the side portion 30a. A spring 67 is provided between the first projecting portion 65a of the stopper 65 and a small projection 30c formed on the side portion 30a of the lens holder 30, the projection 30c being located adjacent the hole 30d. Therefore, the stopper 65 is normally urged in a direction where the side plate 40a of the frame 40 is located, the stopper 65 is arranged such that it is inserted into one of the plurality of the position setting holes 44a.

Figure 5:
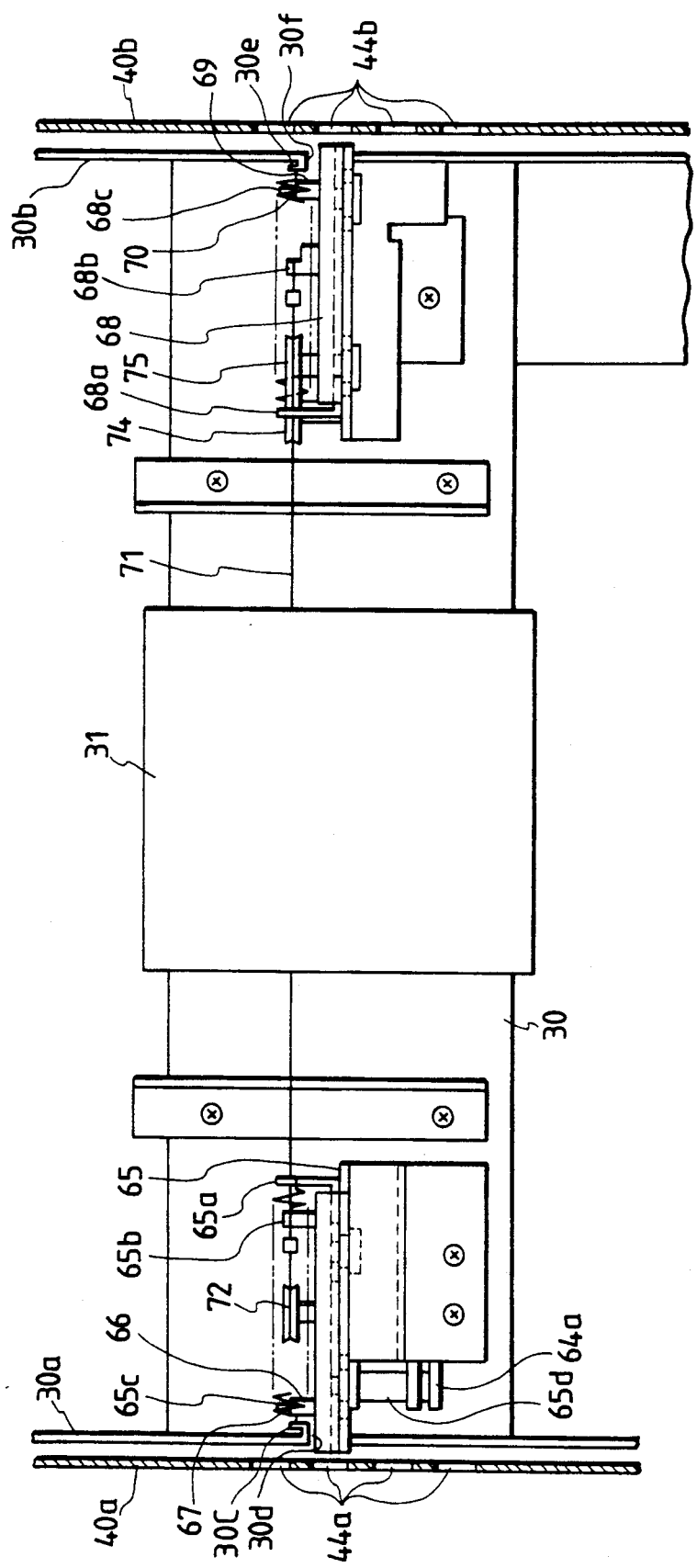
FIG. 5 is a front view, partly cut away, of a mechanism for varying copying magnification according to the second embodiment of the invention.
Figure 6:
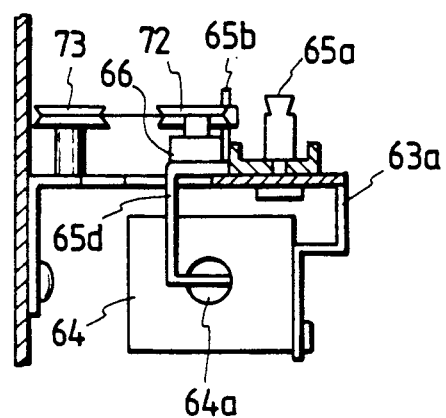
FIG. 6 is a cross-sectional view taken along the line VI-VI of FIG. 4.

The tip end of the bracket 65d of the stopper 65 is connected to a plunger 64a of the solenoid 64 as shown in FIG. 5 and 6. Accordingly, when the solenoid 64 is actuated, the bracket 65d is pulled toward the solenoid 64, that is, the condensing lens 31. As a result, the stopper 65 is moved toward the condensing lens 31 against urging force of the spring 67 to thus pull out the stopper 65 from the position setting hole 44a.

On the other side, on the supporting plate 63b positioned at the other side plate of the lens holder 30, there is provided a stopper 68 which is slidingly movable to and from the side plate 40b in the same manner as the stopper 65.

Figure 4:
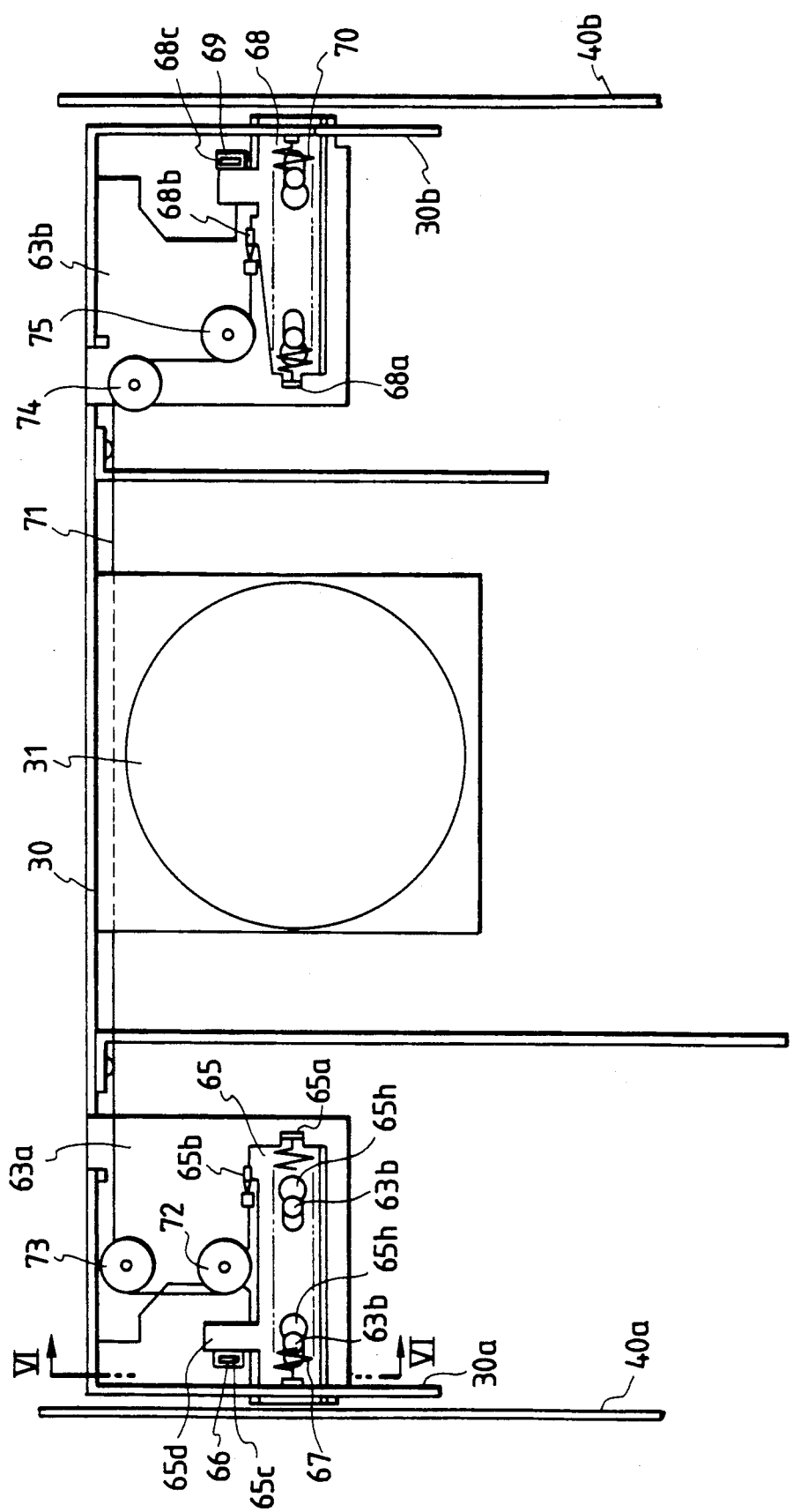
FIG. 4 is a plan view of a mechanism for varying copying magnification according to a second embodiment of the present invention.

The stopper 68 has a first projecting portion 68a extending upwardly at its side end positioned at the side where the condensing lens 31 is located, a second projecting portion 68b extending upwardly and positioned at the central portion thereof, and a third projecting portion 68c adjacent the side plate 40b with which a tube 69 is fitted as shown in FIGS. 4 and 5.

The side end of the stopper 68 at the side where the side plate 40b is located passes through a hole 30f formed in the side portion 30b. A spring 70 is provided between the first projecting portion 68a of the stopper 68 and a small projection 30e formed on the side portion 30b of the lens holder 30, the projection 30e being located adjacent the hole 30f. Therefore, the stopper 68 is normally urged in a direction where the side plate 40b of the frame 40 is located, the stopper 68 is arranged such that it is inserted into one of the plurality of the position setting holes 44b. However, a solenoid is not provided adjacent this stopper 68, therefore, the stopper 68 is not connected to a solenoid.

Both tubes 66, 69 fitted with the respective third projecting portion 65c, 68c reduce the impact which occurs when the stoppers 65, 68 collide with the lens holder 30 because of the urging forces of the springs 67, 70 thus preventing noise and damage to the components.

The two second projecting portions 65b, 68b of the stoppers 65, 68 are interconnected with each other by a wire 71.

The wire 71 extends from its one end fixed at the second projecting portion 65b of the stopper 65, toward the side plate 40a, then changes its direction over pulleys 72, 73 provided on the supporting plate 63a, extends toward the stopper 68 and through pulleys 74, 75 provided on the supporting plate 63b to where it is fixed at the other end on the second projecting portion 68b. Therefore, when the stopper 65 moves towards the condensing lens 31, the other stopper 63 also moves toward the condensing lens 31, and when the stopper 65 moves toward the side plate 40a of the frame 40, the stopper 68 moves toward the side plate 40b of the frame 40.

Next, operation of the mechanism for varying copying magnification thus constructed will be described.

While the copying operation is carried out or stopped, the two stoppers 65, 68 are inserted into and engaged with the respective position setting holes 44a, 44b by the urging forces of the springs 67, 70 and the lens unit 10 is fixed at a certain position.

When the copying magnification is changed and the lens holder 30 is vertically moved by a driving source (not shown in the drawings), the signal solenoid 64 is actuated and the stopper 65 is attracted toward the condensing lens 31. Therefore, the stopper 65 moves toward the condensing lens 31 against urging force of the spring 67 and is pulled from the position setting hole 44a formed on the side plate 40a. At the same time, the other stopper 68 is pulled by the wire 71 interconnecting the two stoppers 65, 68. Therefore, the stopper 68 is moved toward the condensing lens 31 against the urging force of the spring 70 and pulled from the position setting hole 44b formed on the side plate 40b. As a result, neither stopper 65, 68 obstructs vertical movement of the lens unit 10.

In this embodiment, the stoppers 65, 68 can be inserted into the position setting holes 44a, 44b or pulled out from the position setting holes 44a, 44b by a single actuator comprising the solenoid 64. Consequently, the components of the lens unit 10 which move vertically are a light weight structure, requiring a small driving source, and overall apparatus becomes a light weight structure. Further, the apparatus becomes compact and can be easily assembled and wired.

In summary, according to the second embodiment of the present invention, since inserting of or pulling out of the stoppers, provided on the lens unit, with respect to the position setting holes is effected by a single actuator using a wire, the mechanism for varying copying magnification becomes a simple structure and the overall apparatus becomes a light weight structure. Further, the apparatus becomes compact is low cost, and can be easily assembled and wired.

Further, since the lens unit is driven by a single actuator such as an stepping motor, the lens unit can be a light weight structure. Therefore, the driving source can also be of a small power and has high reliability.

A third embodiment will be described below with reference to FIGS. 7 through 10. The third embodiment pertains to an improvement on the lens unit.

Figure 7:
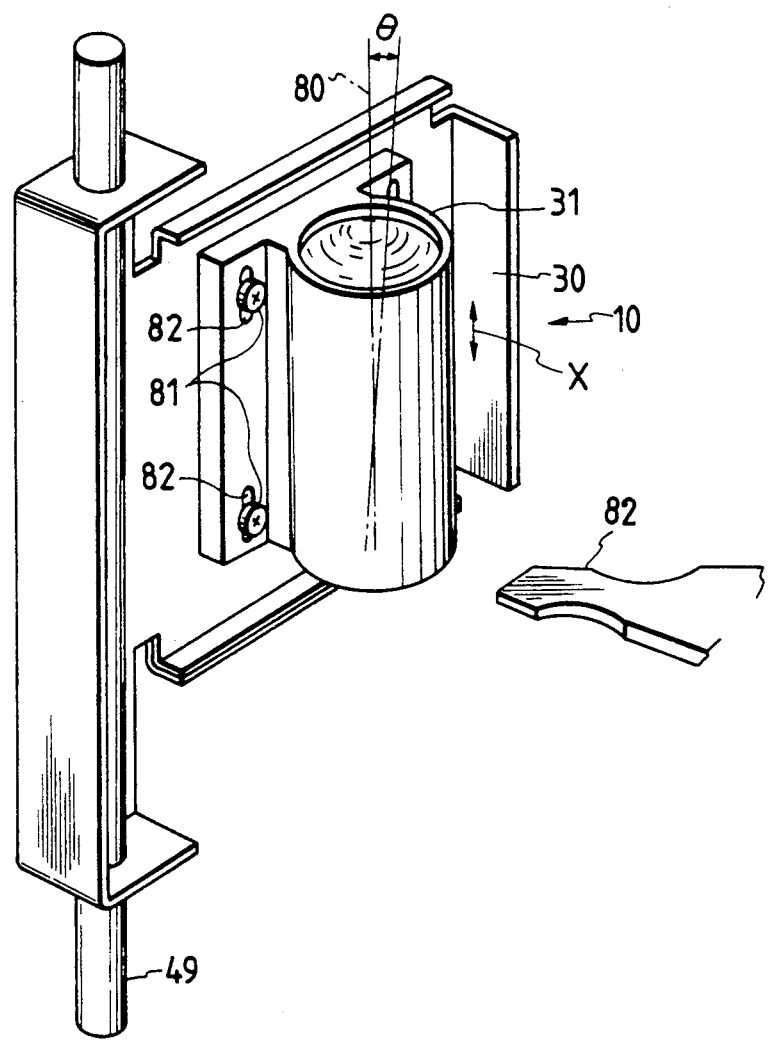
FIG. 7 is a perspective view showing an inhouse technique of adjusting a lens unit.
Figure 8:
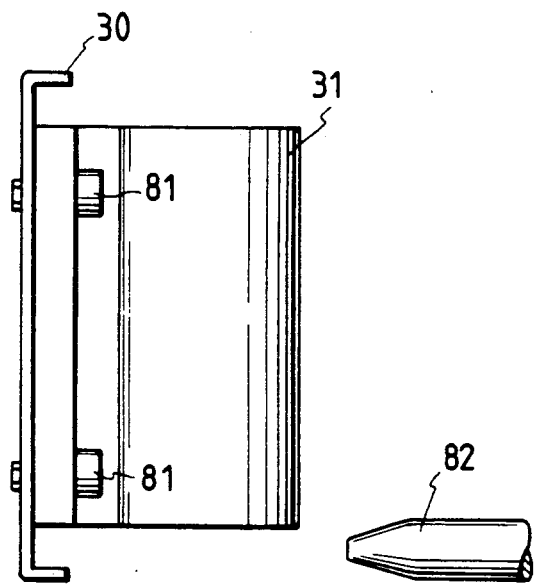
FIG. 8 is a side view showing an inhouse technique of adjusting the lens unit.

There is an inhouse technique or procedure known to the instant inventors concerning a fixing method of the condensing lens as shown in FIGS. 7 and 8.

As shown in FIGS. 7 and 8, the condensing lens 31 in the lens unit 10 is directly attached to the lens holder 30 by four screws 81. When an optical axis 80 of the condensing lens 31 is adjusted, four screws 81 are loosened, therefore a tool 83 such as a screw driver is inserted between the lens holder 30 and the condensing lens 31 to forcibly move the condensing lens. 31 up for a vertical distance corresponding to the length of oblong holes 82 and to adjust a vertical position X, or to incline the condensing lens 31 for an angle θ available by the width of the oblong holes 82.

However, in the above fixing method, it is difficult to adjust the optical axis 80. That is, after the inclination angle θ of the optical axis 80 is adjusted, the condensing lens 31 is moved to adjust the vertical position X. In that case, the inclination angle θ is displaced from the normal position already adjusted and readjustment is required. Therefore, it is necessary to repeat the above adjustments several times and adjustment of the optical axis 80 is troublesome. On the other hand, in case where the vertical position X is adjusted, then the inclination angle θ is first adjusted and there occur the same problems.

The third embodiment can solve such disadvantage. It is, therefore, an object of the present invention to provide an image recording apparatus in which an optical axis of a condensing lens can be easily adjusted.

In the third embodiment, the general structure of the copying machine is identical with the machine in FIG. 1. However, in the third embodiment, an improved device for fixing the condensing lens to the lens holder which can be incorporated in the copying machine is provided as shown in FIGS. 9 and 10.

Figure 10:
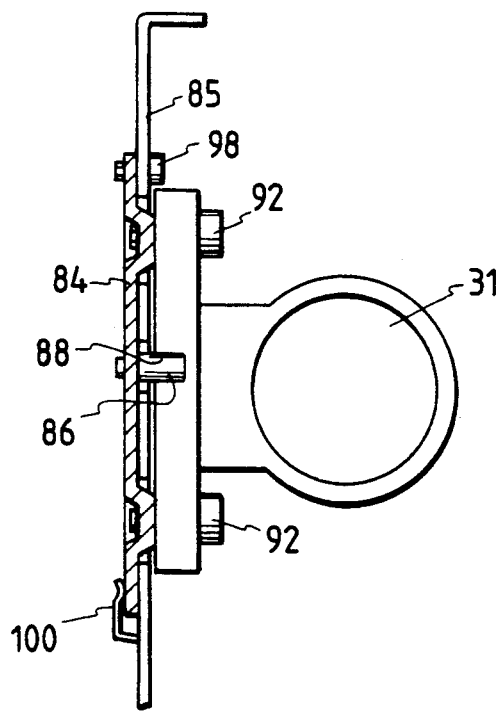
FIG. 10 is a cross-sectional view showing the lens unit of the third embodiment of the invention.
Figure 9:
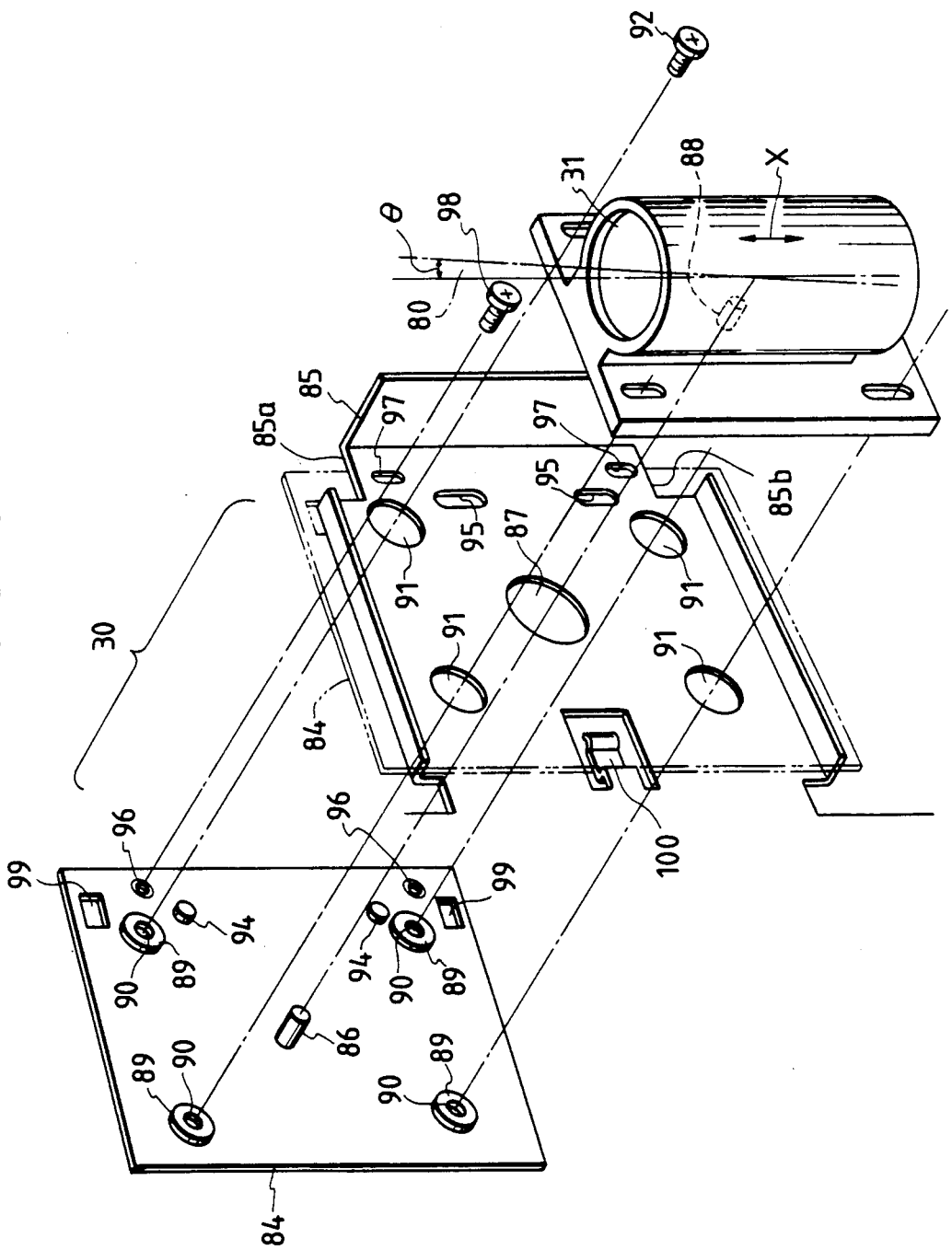
FIG. 9 is a enlarged exploded perspective view showing the lens unit of a third embodiment of the invention.

As shown in FIGS. 9 and 10, a lens holder 30 comprises a movable plate 84 which is vertically movable and an attachment plate 85 to which the condensing lens 31 is attached. The movable plate 84 is provided, at its center, with a center pin 86 fixed thereto. The center pin 86 passes through a central hole 87 of the attachment plate 85 and is rotatably fitted with a receiving bore 88 of the condensing lens 31. The movable plate 84 is integrally formed, at the corners thereof, with four circular projections 89 each having a female thread 90 at its center. The thickness of each projection 89 is slightly thicker than that of the attachment plate 85. The circular projections 89 are aligned with holes 91 formed on the attachment plate 85, the diameter of the hole 91 being considerably larger than that of the circular projection 89. Screws 92 for fixing the condensing lens 31 are threaded with the female threads 90 formed on the projections 89 positioned in the holes 91.

Further, the movable plate 84 is provided with a pair of fixing pins 94 fixed at upper and lower portions thereto. The pair of fixing pins 94 are aligned with oblong holes 95 formed on the attachment plate 85 so that the movable and attachment plates 84,85 are relatively movable only in a longitudinal direction of the oblong holes 95. The movable plate 84 is formed with a pair of female threads 96 at upper and lower portions thereof. The pair of female threads 96 are aligned with a pair of oblong holes 97 so that fixing screws 98 are threaded with the female threads 96 through the oblong holes 97.

Next, operation of the third embodiment thus constructed will be described below.

When the optical axis 80 of the condensing lens 31 is adjusted, first the four screws 92 are loosened and the angle θ of the optical axis 80 is adjusted. The condensing lens 31 is positioned on the movable plate 84 by the center pin 86 without allowing relatively vertical movement, this adjustment is easily performed. Next, four screws 92 are tightened and the condensing lens 31 is fixed to the movable plate 84. Thereafter, the vertical position X of the optical axis 80 is adjusted. This adjustment of the vertical distance of the condensing lens 31 is performed with relatively vertical movement of the movable and attachment plates 84, 85 for a distance corresponding to that of the oblong holes 85. After finishing the vertical adjustment of the condensing lens 31, the fixing screws 98 are fastened to fix the attachment plate 85 to the movable plate 84, resulting in fixing three members 31,84,85 together as a unit.

Further, the movable plate 84 is provided, at upper and lower right portions thereof, with two rectangular holes 99 for inserting a tool such as a screw driver and adjusting a relatively vertical portion of the movable and attachment plates 84, 85 after the movable plate 84 is attached to the attachment plate 85 provisionally. That is, the rectangular holes 99 are positioned in confrontation with shoulders 85a, 85b provided at upper and lower right portions of the attachment plate 85 respectively so that the tool such as a screw driver contacts the shoulders 85a, 85b to move the attachment plate 85 up and down relative to the movable plate 84 through the rectangular holes 99. The attachment plate 85 has an engagement 100 integrally formed at the center left side portion in FIG. 9. The engagement 100 clips and holds the movable plate 84 slightly.

According to this embodiment, after the inclination angle θ of the optical axis 80 is adjusted, the condensing lens 31 is fixed to the movable plate 84 and the movable plate 84 together with the condensing lens 31 is moved to adjust the vertical position X, and then the movable plate 84 is fixed to the attachment plate 85. Therefore, while retaining the already adjusted inclination angle θ of the optical axis 80, the vertical portion X of the optical axis 80 can be adjusted. As a result, there is no problem of displacement in the inclination angle θ, which can happen in the inhouse technique as shown in FIGS. 7 and 8 upon adjusting the vertical position X of the optical axis 80, and the overall adjustment of the optical axis 80 can be easily performed.

In summary, in the third embodiment, the movable plate is vertically movably fixed to the attachment plate and the condensing lens is fixed to the movable plate in such a manner that the inclination angle of the optical is adjustable. First, the inclination angle of the optical axis is adjusted and condensing lens is then to the movable plates. The vertical position of the optical axis is not adjusted by moving the movable plate vertically before the movable plate is fixed to the attachment plate. Therefore, since the vertical position of the optical angle can be adjusted while retaining the already adjusted inclination angle of the optical axis, the overall adjustment of the optical angle can be easily accomplished.

A fourth embodiment will be described below with reference to FIGS. 11 and 12. The fourth embodiment pertains to an improvement on the lens unit, and more particularly, to an improvement on a fixing method for the condensing lens shown in FIGS. 7 and 8.

In the fixing method shown in FIGS. 7 and 8, it is difficult to adjust the optical axis 80 because there is no guide groove which guides the condensing lens 31 to facilitate positioning of the condensing lens 31. Therefore, skill and time are required to adjust the optical axis.

The fourth embodiment can solve such disadvantage. It is, therefore, an object of the present invention to provide an image recording apparatus in which an optical axis of a condensing lens can be easily adjusted in a short time without requiring great skill.

In the fourth embodiment, the general structure of the copying machine is identical with the machine shown in FIG. 1. However, in the fourth embodiment, an improved for fixing the condensing lens to the holder which can be incorporated in the copying machine is provided as shown in FIG. 11 and 12. The perspective view of the lens unit in the fourth embodiment is identical with that of the lens unit in FIG. 7. As such, this embodiment will be described with reference to FIGS. 7, 11 and 12.

Figure 11:
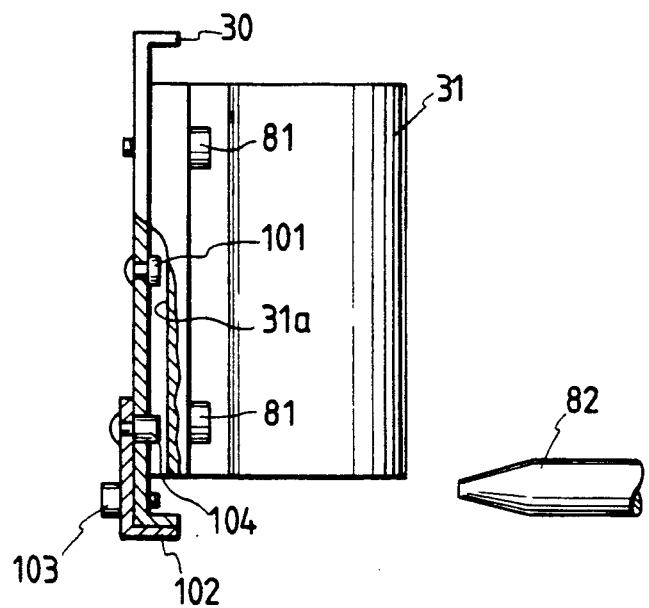
FIG. 11 is a side view, partly cut away, showing the lens unit of a fourth embodiment of the present invention.
Figure 12:
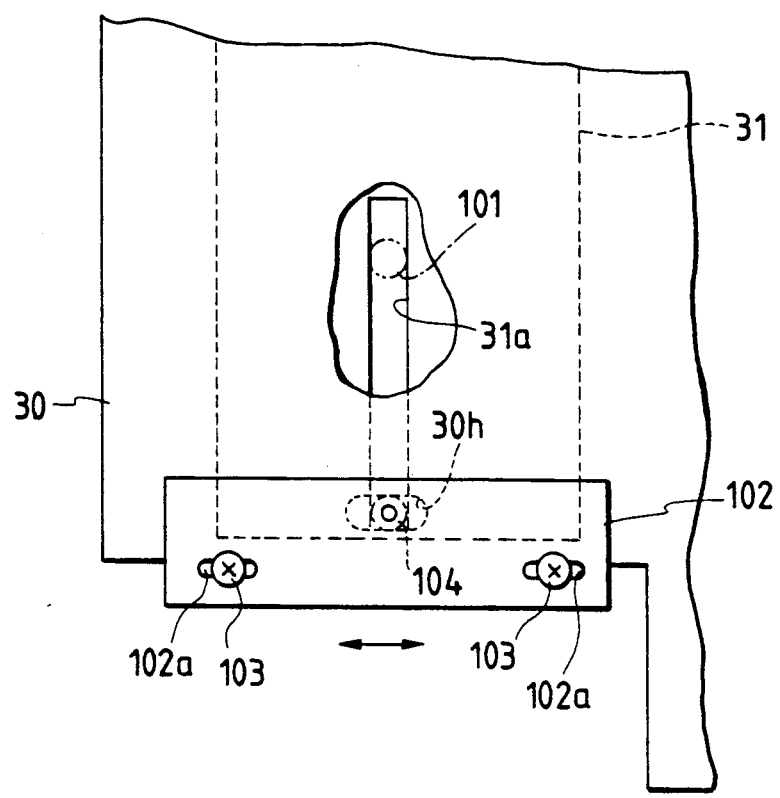
FIG. 12 is a back view, partly cut away, showing the lens unit of the fourth embodiment of the invention.

As shown in FIGS. 7 and 11, the condensing lens 31 in the lens unit 10 is attached to the lens holder 30 consisting an attachment plate by four screws 81 which are threaded with the lens holder 30 through oblong holes 82. Therefore, the condensing lens 31 is movable for a vertical and horizontal distance available by the clearance between the hole 82 and the screw 81. The condensing lens 31 is formed with a vertical groove 31a extending in a vertical direction and positioned adjacent to the lens holder 30. The lens holder 30 has a first pin 101 fixed thereto which is fitted with the vertical groove 31a. The first pin 101 is positioned at approximately the central portion of the condensing lens 31. At the lower portion of the lens holder 30, there is provided a sliding plate 102 which is sliding movable in a horizontal direction. The sliding plate 102 is fixed to the lens holder 30 by screws 103 which are threaded with the lens holder 30 through oblong holes 102a of the sliding plate 102. The sliding plate 102 has a second pin 104 fixed thereto which passes through an oblong hole 30h on the lens holder 30 and is also fitted with the vertical groove 31a.

Next, operation of the fourth embodiment thus constructed will be described.

When the optical axis 80 of the condensing lens 31 is adjusted, first, the four screws 81 are loosened and a tool 83 such as a screw driver is inserted between the lens holder 30 and the condensing lens 31 to move the condensing lens 31 in a vertical direction and to adjust the vertical position X in FIG. 7. Thereafter the screws 103 are loosened slightly, the sliding plate 102 is moved in a horizontal direction to rotate the condensing lens 31 about the first pin 101, to thereby adjust the inclination angle θ of the condensing lens 31. Next, the screws 103 are fastened to fix the sliding plate 102 to the lens holder 30, then the screws 81 are tightened to fix the condensing lens 31 to the lens holder 30 and the adjustment of the optical axis 80 finishes.

In the fourth embodiment, since the inclination angle θ is adjusted by moving the sliding plate 102, the adjustment work can be easily performed. Further, the vertical position of the condensing lens 31 can be easily adjusted while the first and second pins 101, 104 guide the vertical groove 31a.

In summary, according to the fourth embodiment, since the inclination angle θ of the condensing lens can be adjusted by moving the sliding plate, the adjustment work can be performed in a short time without requiring great skill.

Although certain preferred embodiments have been shown and described, it should be understood that many changes and modifications may made therein without departing from the scope of the appended claims.

What is claimed is:

1. An image recording apparatus for recording an image corresponding to an original on a photosensitive recording medium by irradiating light onto the original and converging light from the original onto said photosensitive recording medium, the apparatus comprising:
   a frame;
   a light source for irradiating light onto said original;
   a lens unit provided between said light source and an exposure zone at which the recording medium is exposed, said lens unit movably supported by said frame along a path of light from said original for converging light from said original and forming an image on said photosensitive recording medium;
   drive means for moving said lens unit along said path of light;
   magnification setting means for setting magnification;
   a plurality of position setting portions provided in said frame and arrayed in parallel to said path of light, neighboring position setting portions being spaced away from each other;
   position setting means provided on said lens unit and being engageable with one of said position setting portions for fixing said lens unit to said frame;
   urging means provided on said lens unit for urging said position setting means toward said frame;
   actuating means provided on said lens unit for actuating said position setting means so that said position setting means moves away from said frame against an urging force of said urging means when electric current is supplied to said actuating means and
   control means for controlling said drive means and said actuating means to move said lens unit in response to said magnification set by said magnification setting means while supplying electric current to said actuating means.

2. The image recording apparatus according claim 1, wherein said lens unit is vertically movable.

3. The image recording apparatus according claim 2, wherein said position setting portions are formed with position setting holes.

4. An image recording apparatus for recording an image corresponding to an original on a photosensitive recording medium by irradiating light onto the original and converging light from the original onto said photosensitive recording medium, the apparatus comprising:
   a frame;
   a light source for irradiating light onto said original;

a lens unit provided between said light source and an exposure zone at which the recording medium is exposed, said lens unit movably supported by said frame along a path of light from said original for converging light from said original and forming an image on said photosensitive recording medium;

drive means for moving said lens unit along said path of light;

magnification setting means for setting magnification;

a plurality of position setting portions provided in said frame and arrayed in parallel to said path of light, neighboring position setting portions being spaced away from each other;

position setting means provided on said lens unit and being engageable with one of said position setting portions for fixing said lens unit to said frame;

urging means provided on said lens unit for urging said position setting means toward said frame;

actuating means provided on said lens unit for actuating said position setting means so that said position setting means moves away from said frame against an urging force of said urging means when electric current is supplied to said actuating means;

error detecting means for detecting occurrence of an error; and control means for controlling said drive means and said actuating means to move said lens unit in response to said magnification set by said magnification setting means while supplying electric current to said actuating means, wherein when said error detecting means detects the occurrence of error during movement of said lens unit, electric current to said actuating means being cut off to move said position setting means by said urging force of said urging means and to fix said lens unit to said frame.

5. The image recording apparatus according to claim 4, wherein said control means controlling said drive means for moving said lens unit to one of said position setting portions positioned most adjacent to a position where said lens unit is positioned when said error detecting means detects occurrence of error and before electric current to said actuating means is cut off.

6. The image recording apparatus according to claim 5, wherein said control means comprises a storage means storing therein position data corresponding to positions of the position setting portions, a one position setting portion being determined for engagement of the position setting means with the one position setting portion on a basis of the position data and a position of the lens unit at a time of the occurrence of error.

7. The image recording apparatus according to claim 1, wherein said urging means comprises a spring.

8. The image recording apparatus according to claim 1, wherein said actuating means comprises a solenoid.

9. An image recording apparatus for recording an image corresponding to an original on a photosensitive recording medium by irradiating light onto the original and converging light from the original onto said photosensitive recording medium, the apparatus comprising:

a frame;

a light source for irradiating light onto said original;

a lens unit provided between said light source and an exposure zone at which the recording medium is exposed, said lens unit movably supported by said frame along a path of light from said original for converging light from said original and forming an image of said photosensitive recording medium;

drive means for moving said lens unit along said path of light;

magnification setting means for setting magnification;

a plurality of position setting portions provided in said frame and arrayed in parallel to said path of light, neighboring position setting portions being spaced away from each other;

position setting means provided on said lens unit and being engageable with one of said position setting portions for fixing said lens unit to said frame;

urging means provided on said lens unit for urging said position setting means toward said frame;

actuating means provided on said lens unit for actuating said position setting means so that said position setting means moves away from said frame against an urging force of said urging means when electric current is supplied to said actuating means;

control means for controlling said drive means and said actuating means to move said lens unit in response to said magnification set by said magnification setting means while supplying electric current to said actuating means; and a wire, wherein said position setting means comprises a plurality of stoppers provided at different positions of said lens unit, said urging means comprising a plurality of urging members provided corresponding to said plurality of stoppers, said actuating means comprising a single actuator, and said plurality of stoppers being interconnected with said wire so that when one of said stoppers is actuated by said actuator, another of said stoppers is actuated simultaneously.

10. The image recording apparatus according to claim 1, wherein said lens unit comprises an attachment plate vertically movably supported by said frame, a movable plate vertically movably attached to said attachment plate, and a condensing lens rotatably supported on said movable plate for converging light from said original and forming an image on said photosensitive recording medium.

11. An image recording apparatus for recording am image corresponding to an original on a photosensitive recording medium by irradiating light onto the original and converging light from the original onto said photosensitive recording medium, the apparatus comprising:

a frame;

a light source for irradiating light onto said original;

a lens unit provided between said light source and an exposure zone at which the recording medium is exposed, said lens unit movably supported by said frame along a path of light from said original for converging light from said original and forming an image on said photosensitive recording medium;

drive means for moving said lens unit along said path of light;

magnification setting means for setting magnification;

a plurality of position setting portions provided in said frame and arrayed in parallel to said path of light, neighboring position setting portions being spaced away from each other;

position setting means provided on said lens unit and being engageable with one of said position setting portions for fixing said lens unit to said frame;

urging means provided on said lens unit for urging said position setting means toward said frame;

actuating means provided on said lens unit for actuating said position setting means so that said position setting means moves away from said frame against an urging force of said urging means when electric current is supplied to said actuating means; and control means for controlling said drive means and said actuating means to move said lens unit in response to said magnification set by said magnification setting means while supplying electric current to said actuating means, wherein said lens unit comprises an attachment plate vertically movably supported by said frame and having a first pin, a condensing lens body supported on said attachment plate for converting light from said original and forming an image on said photosensitive recording medium, the lens body having a guide groove extending in one direction and engageable with said first pin, and a sliding plate supported on said attachment plate and movable in a direction perpendicular to said groove and having a second pin engageable with said guide groove so that movement of said sliding plate causes said condensing lens body to rotate about said first pin.

12. An image recording apparatus for recording an image corresponding to an original on a photosensitive recording medium by irradiating light onto the original and converging light from the original onto said photosensitive recording medium, the apparatus comprising:
   a frame;
   a light source for irradiating light onto said original;
   a lens unit provided between an exposure zone at which the recording medium is exposed and said light source for converging light from said original and forming an image on said photosensitive recording medium; said lens unit comprising;
   an attachment plate vertically movably supported by said frame;
   a movable plate vertically movably attached to said attachment plate; and
   a condensing lens rotatably mounted on said movable plate for converging light from said original and forming an image on said photosensitive recording medium.

13. An image recording apparatus for recording an image corresponding to an original on a photosensitive recording medium by irradiating light onto the original and converging light from the original onto said photosensitive recording medium, the apparatus comprising:
   a frame;
   a light source for irradiating light onto said original;
   a lens unit provided between an exposure zone at which the recording medium is exposed and said light source for converging light from said original and forming an image on said photosensitive recording medium, said lens unit comprising:
   an attachment plate vertically movably supported by said frame;
   a movable plate vertically movably attached to said attachment plate; and
   a condensing lens rotatably mounted on said movable plate for converging light from said original and forming an image on said photosensitive recording medium, wherein said attachment plate is positioned between said movable plate and said condensing lens body, and said movable plate is provided with a center pin and said condensing lens body is formed with a receiving bore engageable with said center pin through said attachment plate, so that said condensing lens body is pivotally supported by said movable plate to said attachment plate.

14. The image recording apparatus according to claim 13, wherein said attachment plate is formed with a center hole through which said center pin extends and is further formed with a plurality of holes having inner diameters, and wherein said movable plate is provided with equal plurality of projections having outer diameters smaller than the inner diameters of said holes, each of the projections being positioned within each of the holes.

15. The image recording apparatus according to claim 14, wherein each of said plurality of projections is formed with a female thread, said condensing lens body is formed with an equal plurality of oblong holes, and said lens unit further comprises screws extending through said oblong holes to be threadedly engageable with the female threads so that vertical position of the condensing lens body and said movable plate relative to said attachment plate is changeable.

16. An image recording apparatus for recording an image corresponding to an original on a photosensitive recording medium by irradiating light onto the original and converging light from the original onto said photosensitive recording medium, the apparatus comprising;
   a frame;
   a light source for irradiating light onto said original;
   a lens unit provided between said light source and an exposure zone at which the recording medium is exposed for converging light from said original and forming an image on said photosensitive recording medium; said lens unit comprising;
   an attachment plate vertically movably supported by said frame, said attachment plate having a first pin;
   a condensing lens body supported on said attachment plate for converging light from said original and forming an image on said photosensitive recording medium, said condensing lens body having a guide groove extending in one direction and engageable with said first pin; and
   a sliding plate supported on said attachment plate, said sliding plate being movable in a second direction perpendicular to said first direction and having a second pin engageable with said guide groove so that movement of said sliding plate causes said condensing lens body to pivot about said first pin.

17. The image recording apparatus according to claim 16, wherein said attachment plate is formed with an oblong hole extending in the second direction, said second pin passing through the oblong hole and reaching the guide groove, and wherein said sliding plate is formed with a plurality of slots extending in the second direction, and wherein said lens unit further comprises screws passing through said plurality of slots and engageable with said attachment plate for moving and fixing the position of the sliding plate in the second direction relative to the attachment plate, to thereby pivot the condensing lens body about said first pin.

* * * * *